(12) United States Patent
Mulder et al.

(10) Patent No.: US 7,038,763 B2
(45) Date of Patent: May 2, 2006

(54) KIT OF PARTS FOR ASSEMBLING AN OPTICAL ELEMENT, METHOD OF ASSEMBLING AN OPTICAL ELEMENT, OPTICAL ELEMENT, LITHOGRAPHIC APPARATUS, AND DEVICE MANUFACTURING METHOD

(75) Inventors: Heine Melle Mulder, Eindhoven (NL); Hendrikus Robertus Marie Van Greevenbroek, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 98 days.

(21) Appl. No.: 10/447,271

(22) Filed: May 29, 2003

(65) Prior Publication Data

US 2004/0012764 A1    Jan. 22, 2004

(30) Foreign Application Priority Data

May 31, 2002   (EP)   .................................. 02253851
Dec. 3, 2002   (EP)   .................................. 02258349

(51) Int. Cl.
*G03B 27/54*   (2006.01)
*G03B 27/42*   (2006.01)
*G02B 7/02*    (2006.01)

(52) U.S. Cl. ........................... 355/67; 355/53; 359/821
(58) Field of Classification Search .................. 355/53, 355/55, 67–71; 359/811–820
See application file for complete search history.

(56) References Cited

U.S. PATENT DOCUMENTS

| | | | | |
|---|---|---|---|---|
| 4,433,907 A | * | 2/1984 | Tarsia ........................... | 355/55 |
| 5,453,814 A | * | 9/1995 | Aiyer ............................ | 355/70 |
| 5,559,583 A | | 9/1996 | Tanabe | |
| 5,815,247 A | | 9/1998 | Poschenrieder et al. | |
| 6,211,944 B1 | | 4/2001 | Shiraishi ...................... | 355/53 |
| 6,307,618 B1 | | 10/2001 | Suzuki et al. ................. | 355/53 |
| 6,411,368 B1 | * | 6/2002 | Matsumoto et al. .......... | 355/67 |
| 6,441,958 B1 | * | 8/2002 | Yeung et al. ................. | 359/372 |
| 6,563,567 B1 | * | 5/2003 | Komatsuda et al. .......... | 355/71 |
| 6,671,035 B1 | * | 12/2003 | Eurlings et al. ............... | 355/71 |
| 6,710,855 B1 | * | 3/2004 | Shiraishi ....................... | 355/67 |
| 2001/0043318 A1 | | 11/2001 | Mori ............................ | 355/53 |

FOREIGN PATENT DOCUMENTS

| | | |
|---|---|---|
| EP | 0949541 A2 | 10/1999 |
| EP | 1109067 A2 | 6/2001 |

* cited by examiner

*Primary Examiner*—Henry Hung Nguyen
(74) *Attorney, Agent, or Firm*—Pillsbury Winthrop Shaw Pittman, LLP

(57) ABSTRACT

A kit of parts for assembling an optical element for use in a lithographic apparatus includes a large number of different small pieces which direct light into respective regions of the pupil plane of the radiation system and/or change the polarization state of incident radiation. The previously manufactured pieces are selected and assembled into an optical element to rapidly create a desired intensity distribution. The optical element may also be disassembled and the pieces reused.

20 Claims, 4 Drawing Sheets

KIT OF PARTS FOR ASSEMBLING AN OPTICAL ELEMENT, METHOD OF ASSEMBLING AN OPTICAL ELEMENT, OPTICAL ELEMENT, LITHOGRAPHIC APPARATUS, AND DEVICE MANUFACTURING METHOD

This application claims priority to European Applications 02258349.6, filed Dec. 3, 2002, and 02253851.6, filed May 31, 2002, which are incorporated in their entirety by reference herein.

BACKGROUND OF THE INVENTION

1. Field of the Invention

The present invention relates to the assembly of optical elements for effecting a desired change in incident radiation to be used in a lithographic apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny minors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam of radiation in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

It is well-known in the art of lithography that the image of a mask pattern can be improved, and process windows enlarged, by appropriate choice of the angles at which the mask pattern is illuminated. In an apparatus having a Koehier illumination arrangement, the angular distribution of light illuminating the mask is determined by the intensity distribution in a pupil plane of the illumination system, which can be regarded as a secondary source. Illumination modes are commonly described by reference to the shape of the intensity distribution in the pupil plane. Conventional illumination, i.e. even illumination from all angles from 0 to a certain maximum angle, requires a uniform disk-shaped intensity distribution in the pupil plane. Other commonly-used intensity distributions are: annular, in which the intensity distribution in the pupil plane is an annulus; dipole illumination, in which there are two poles in the pupil plane; and quadrupole illumination, in which there are four poles in the pupil plane. To create these illumination schemes, various methods have been proposed. For example, a zoom-axicon, that is a combination of a zoom lens and an axicon, can be used to create conventional or annular illumination with controllable inner and outer radii ($\sigma_{inner}$ and $\sigma_{outer}$) of the annulus. To create dipole and quadrupole type illumination modes, it has been proposed to use spatial filters, that is opaque plates with apertures located where the poles are desired, as well as arrangements with movable bundles of optical fibers. Using spatial filters is undesirable because the resulting loss of light reduces the throughput of the apparatus and hence increases its cost of ownership. Arrangements with bundles of optical fibers are complex and inflexible. It has therefore been proposed to use an optical element, such as for example a diffractive or refractive optical element, to form the desired intensity distribution in the pupil plane. See, for example, European patent applications U.S. Pat. Nos. 6,452,662 and 6,671,035. These documents describe, inter alia, diffractive optical elements in which different regions may have different effects, e.g. forming quadrupole or conventional illumination modes so that mixed or "soft" illumination modes can be created.

Diffractive optical elements are currently made by etching different patterns into different parts of the surface of a quartz or $CaF_2$ substrate.

A diffractive optical element offers freedom in determining the intensity distribution in the pupil plane and thus, in theory, would allow the use of an illumination mode giving optimum results, i.e. largest process window, for a given mask pattern. However, the optimum illumination differs from pattern to pattern so that to use optimum illumination settings would require a custom-built diffractive optical element for each pattern to be illuminated. However, in practice it takes many months to manufacture a diffractive optical element so that it is impractical in most cases. Thus, a device manufacturer will instead have a collection of diffractive optical elements suitable for different types of pattern and select the one closest to optimum for a given mask pattern to be imaged.

SUMMARY OF THE INVENTION

It is an aspect of the present invention to provide an optical element that can be assembled quickly and inexpensively to provide a desired illumination mode.

This and other aspects are achieved according to the invention by providing a kit of parts for assembling such an optical element for effecting a desired change in incident radiation at a plane of a radiation system of a lithographic apparatus, the kit of parts including a plurality of previously manufactured optical components, each component having an effect on incident radiation wherein the effect of at least some of the optical components is different than the effect of others of the optical components; and a support constructed and arranged to hold a user selectable subset of the plurality of optical components in an array.

Since the optical element is constructed from a plurality of previously manufactured optical components which are assembled into an array on a holder, it is possible to quickly and easily create an optical element that can create the desired effect, e.g. a desired intensity distribution in a pupil plane of the radiation system. Thus, it is possible to use an optimum, or very close to optimum, illumination pattern for a given mask pattern without the delay and expense otherwise incurred in the construction of, for example, a custom diffractive optical element. The optical components may redirect light and/or effect a change, e.g. a rotation, in polarization state.

The redirective optical components can be seen as effecting a transformation between the angular distribution of incident radiation and the angular distribution of the emitted radiation and so might be termed radiation angular-distribution transformation components. For a given angular-distribution of incident radiation and a desired angular-distribution of emitted radiation, a transformation scheme may be determined. Optical components to effect that scheme are then selected and assembled to form the optical element.

The optical elements may be of a diffractive type, i.e. based on the optical phenomenon of diffraction. In this case, the optical components that make up the kit of parts according to the invention can be formed by manufacturing a set of large diffractive optical elements, each of which directs light into one (or four symmetric) directions and then dividing the large diffractive optical elements into a number of small pieces each. The orientation of the division largely determines the redirective angle of the optical component. Diffractive optical elements are generally designed for a particular wavelength. The kit of parts according to the present invention may comprise diffractive optical components designed for several different wavelengths, for example for a first wavelength equal to that of the radiation beam and for a second wavelength equal to that of an auxiliary beam which may be in the visible or infra-red spectrum.

The optical components may also be refractive, i.e. based on the optical phenomenon of refraction, e.g. in the form of a wedge combined with a power (spherical lens). A refractive element is advantageous as it has a higher transmission than a diffractive element and hence increases throughput.

The optical components may also be reflective, and they may also be diffusive, which is hereinafter defined as having an effect of directing incident radiation into a narrow range of angles.

Polarization state changing optical components may rotate the polarization state of incident radiation, such as done by for example quarter lambda or half lambda plates. They may also polarize incident radiation into, for example, linearly polarized radiation by filtering out a certain component of the incident radiation.

Most desired illumination modes exhibit mirror symmetry about orthogonal axes. In other words, the four quadrants of the intensity distribution in the pupil plane are mirror images of each other. Preferably therefore the optical components each direct light into four mirror-symmetric directions. Even if the radiation system of the lithographic apparatus has a rod-type integrator, which subjects the illumination radiation to multiple internal reflections from four orthogonal faces of the rod so that the four quadrants become mirror images of each other, it is still desirable to have each optical component direct light into four mirror-symmetric directions, because then each point in the pupil plane receives light from multiple optical components, improving uniformity and decreasing sensitivity for transmission differences between optical components or for nonuniform illumination of the optical element.

Preferably, the optical components have shapes that tessellate, i.e. that cover most of the surface of the optical element if repeated contiguously, and have 90° rotational symmetry so that they can be mounted in four different orientations. In the latter case, it is only necessary to provide optical components that direct incident radiation into respective regions of one quadrant of the pupil plane. The rest of the pupil plane can simply be filled by mounting the optical components in different orientations. When a rod-type integrator is used, the respective regions reduce to one half of a quadrant of the pupil plane.

A convenient holder for the optical components may comprise a transparent plate, such as for example a quartz plate, on which the optical components are put in an array, a rigid structure surrounding the array, and another transparent plate on top to keep the optical components in place. The holder may also comprise just one partially transmissive plate on which the optical components are fixed by for example bonding or glueing. Alternatively, the optical components may be glued or held together without contact to a surface, and mounted on, or in, a support. Finally, the holder may comprise a 2D wire frame or a frame with H-profiles that create rows into which the optical components can be slid.

The optical element can alternatively be made by positioning small wedges on a plate-like optical element that directs incident radiation into a narrow range of angles, such an element generally being known as a diffusive plate or diffusor. With such an arrangement, each wedge emits light into a narrow cone directed at an angle determined by the wedge angle. This construction can be made relatively easily and inexpensively.

Preferably, the optical components are releasably mounted on the support so that they can be reused to create a new and different optical element for a different mask pattern. Also, the optical element can be quickly altered between wafers or wafer batches enabling experimentation to find the optimum illumination pattern for a given job.

The present invention also provides a method of assembling an optical element for effecting a desired change in incident radiation at a plane of a radiation system of a lithographic apparatus, the method including selecting, from a plurality of previously manufactured optical components which have different effects on incident radiation, optical components to effect the desired change; and mounting the selected optical components in an array on a support to form the optical element.

Preferably, in selecting optical components to create an intensity distribution with regions of differing intensities, the user selects numbers of optical components directing radiation into the different regions in ratios as close a possible to the desired ratios of intensity. To construct the optical element, the user selects appropriate ones from the plurality of previously manufactured optical components and mounts them on an appropriate holder. The total construction time of, for example, a diffractive optical element is a few hours, compared to a few months when a similar diffractive optical element would be manufactured conventionally.

The present invention provides an optical element for effecting a desired change in incident radiation at a plane of a radiation system of a lithographic apparatus, the optical element including a plurality of previously manufactured optical components, each component having an effect on incident radiation, wherein the effect of at least some of the optical components is different than the effect of others of the optical components; and a support constructed and arranged to hold a user selectable subset of the plurality of optical components in an array. If required, the optical element according to the present invention can be disassembled in order to reuse the optical components and the support.

Yet further, the present invention provides a lithographic apparatus including a radiation system constructed and arranged to provide a beam of radiation; a support constructed and arranged to support a patterning device, the patterning device constructed and arranged to pattern the projection beam according to a desired pattern; a substrate table constructed and arranged to hold a substrate; and a projection system constructed and arranged to project the patterned beam onto a target portion of the substrate; wherein the radiation system comprises an optical element for effecting a desired change in incident radiation at a plane of the radiation system, the optical element being assembled by mounting a user selectable subset of a plurality of previously manufactured optical components having different effects on the incident radiation in an array on a support.

Still further, the present invention provides a device manufacturing method including providing a beam of radiation using a radiation system; using a patterning device to endow the projection beam with a pattern in its cross-section; projecting the patterned beam of radiation onto a target portion of the substrate; and placing an optical element for effecting a desired change in incident radiation at a plane of the radiation system, the optical element being assembled by mounting a user selectable subset of a plurality of previously manufactured optical components having different effects on the incident radiation in an array on a support.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
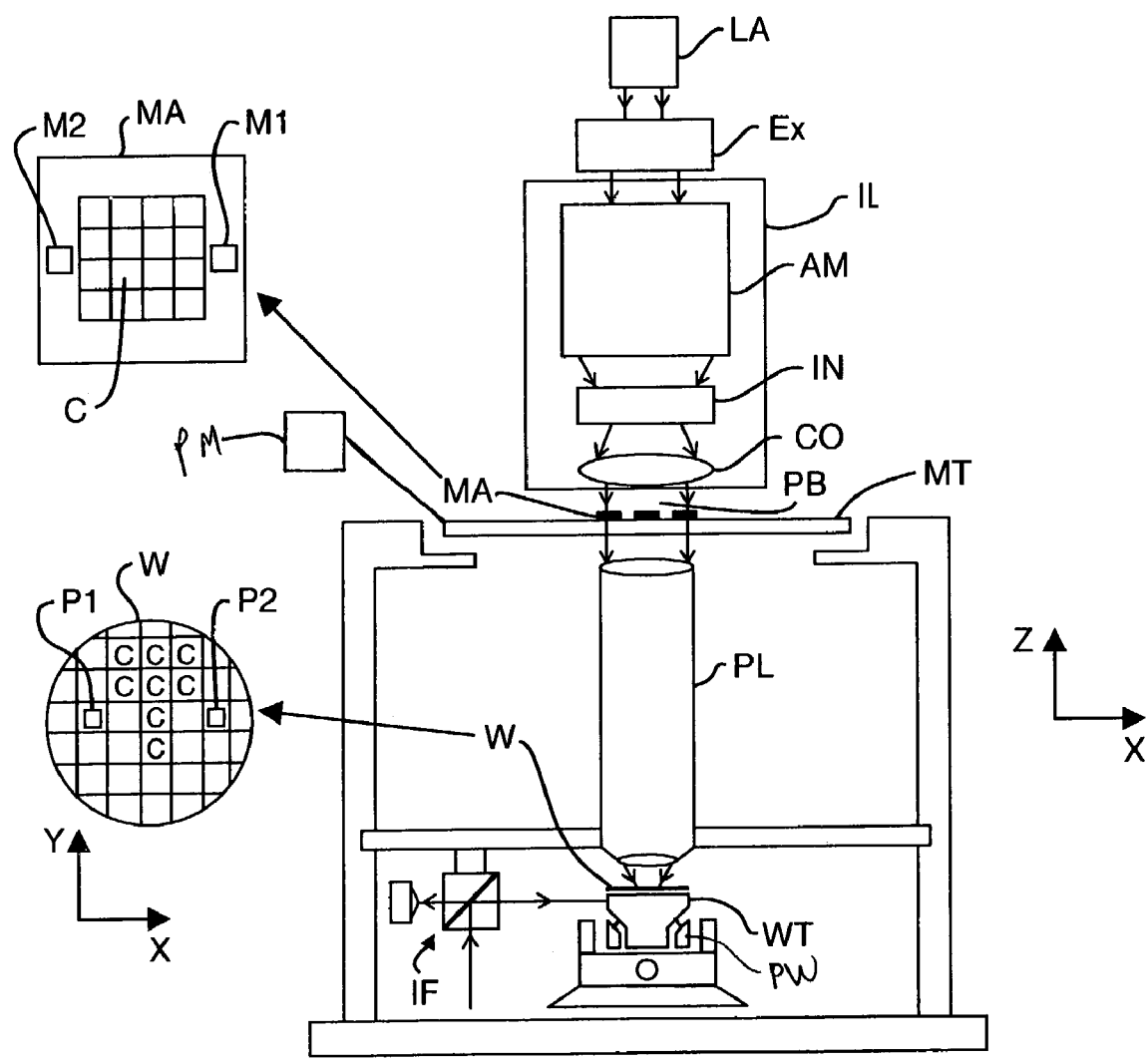
FIG. 1 depicts a lithographic apparatus according to an embodiment of the invention.

FIG. 1 schematically depicts a lithographic projection apparatus 1 according to an embodiment of the invention. The apparatus includes a radiation system Ex, IL constructed and arranged to supply a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e has a transmissive mask). However, in general, it may also be of a reflective type. (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, suit as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing minors). The latter scenario is often the case when the source LA is an excimer laser. The present invention encompasses both of these scenarios. In particular, the present invention encompasses embodiments wherein the radiation system Ex, IL is adapted to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which projects the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA wit respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
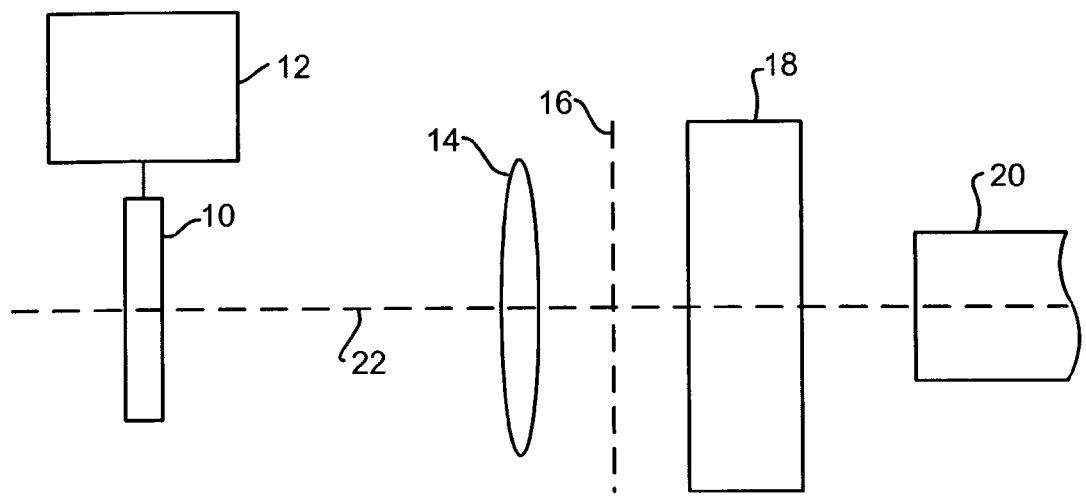
FIG. 2 is an illustration of part of the radiation system of the lithographic apparatus of FIG. 1.

An embodiment of an illuminator according to the invention is shown in FIG. 2. It comprises an optical element 10 in the beam path 22 and an optical element exchanger 12 having access to other optical elements that can be substituted for optical element 10 in the beam path. The exchanger 12 may comprise any suitable device constructed and arranged to insert and remove the optical elements from the beam path, such as a carousel or rotatable disc provided with several optical elements and controllable to position a selected one of the optical elements in the beam path, or a "slide-in-slide-out" mechanism, as employed in a photographic slide projector, for example.

Radiation passing through the optical element 10 is condensed by a single lens 14 to produce a spatial intensity distribution at a pupil plane 16. In an alternative embodiment, the lens 14 is compound, but all its components are fixed, as opposed to the situation in a zoom-axicon, which can also be used in the invention. The pupil plane is located at the back focal plane of lens 14. The choice of optical element 10 determines the angular intensity distribution (i.e. illumination setting or mode) of the illuminator. Each exchangeable optical element 10 defines a particular intensity distribution at pupil plane 16, which in the case of, for example, an annular ring shape can be parametrized by an inner and outer radius.

In this embodiment, the single fixed lens 14 and the plurality of optical elements 10 replace the various (movable) lenses and the two complementary conical components of a zoom-axicon module. After the lens 14, the radiation is coupled by a coupling lens 18 into an integrator rod 20 (or fly's eye lens, for example). The axial location of coupling lens 18 is chosen such that its front focal plane substantially coincides with the pupil plane 16. This embodiment, in which an optical element is used to define completely the intensity distribution at the pupil plane, has no negative impact on performance, as indicated by projection beam characteristics such as uniformity, telecentricity and intensity distribution at the entrance side of integrator rod 20.

Figure 3:
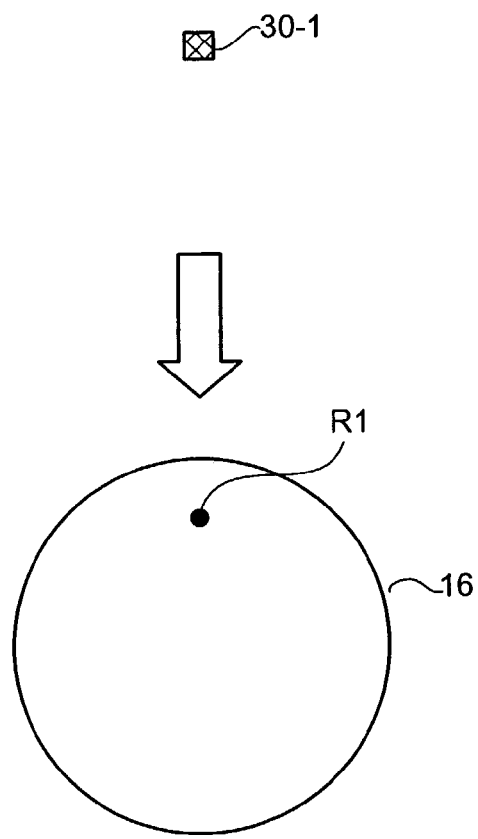
FIG. 3 illustrates that one optical component used in the present invention directs light to a specific region of the pupil plane of the radiation system.

At least one of the exchangeable optical elements 10 is an optical element made up from a plurality of optical components according to the invention. Such a component 30-1 is shown in FIG. 3. It is a piece of, for example, an optical element that directs incident radiation into a range of angles corresponding to a region R1 in the pupil plane 16.

Figure 4:
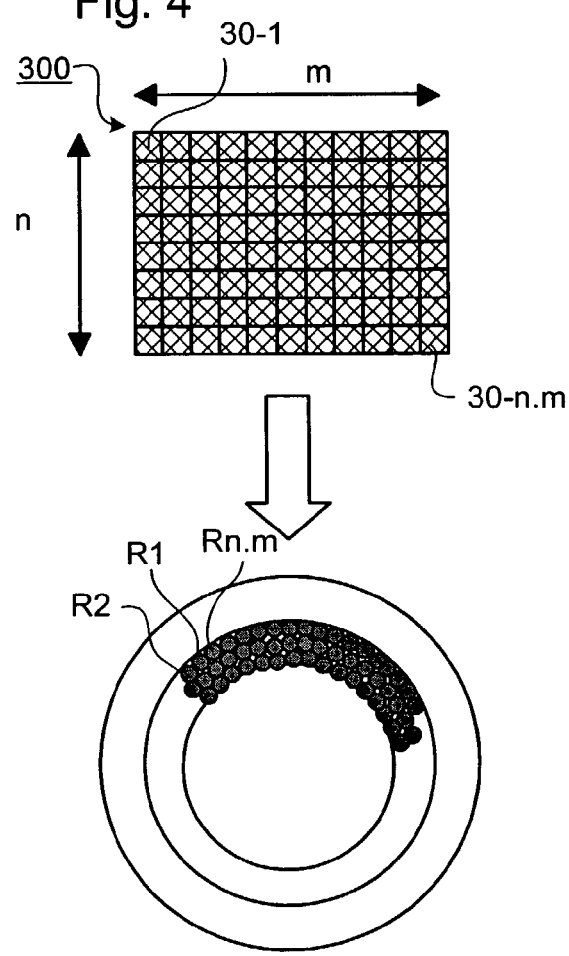
FIG. 4 illustrates an array of optical components forming an optical element according to the present invention and the illumination mode formed in the pupil plane.

FIG. 4 shows an optical element 300 made up of an n-by-m array of optical components 30-1 to 30-n.m. The optical components 30-1 to 30-n.m direct light into respective regions R1 to Rn.m to form the desired illumination mode. In the example shown in FIG. 4 the illumination mode is an annular mode (only some of the regions R1 to Rn.m are shown for convenience). However, by appropriate choice of the optical components 30-1 to 30-n.m, almost any desired illumination mode can be set. It should be noted that the regions R1 to Rn.m may be distinct or may fully or partially overlap each other. In particular, a degree of overlap can be selected to provide variations in intensity.

The optical components 30-1 to 30-n.m are, in this embodiment, square so that there are no gaps between them in the optical element 300 and loss of intensity from the projection beam is therefore minimized. Other tessellating shapes may also be used. Non-tessellating shapes may be used if the resulting loss of intensity is acceptable.

It is also possible to use two or more shapes that tessellate together and it is particularly convenient if those shapes still tessellate if they are individually rotated by 90°, e.g. octagons and squares.

By way of an example, each of the optical components 30-n.m may have rectangular dimensions of 2×3 mm and may be used in an array where n=12 and m=8 to create a square optical element 300 of size 24×24 mm. Other dimensions and shapes are of course possible, depending upon the size and shape of the projection beam where the optical element 300 is positioned. Current diffractive optical elements require a minimum surface area of about 1 $mm^2$ in order to properly redirect incident radiation based on the phenomenon of diffraction. The minimum size of diffractive optical components to be used in the current invention is therefore about 1×1 mm. Handling such small components, a large number of which makes up the optical element 300, is generally not done manually, but by employing a suitable automatic pick and drop manipulator. The minimum number of different optical components 30-n.m assembled into an optical element 300 is generally dictated by the complexity and resolution of the desired intensity distribution in the pupil plane. In general, the more complex and the higher the desired resolution, the higher the required number of different optical components 30-n.m.

Figure 5:
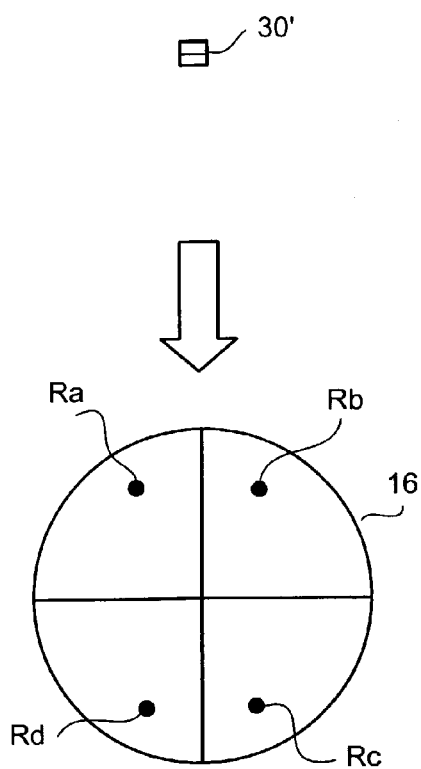
FIGS. 5 and 6 illustrate that an optical component used in an optical element according to the present invention may direct light into different parts of the pupil plane according to its orientation.

In a lithographic apparatus where the rod-type integrator 20 is used, the four quadrants of the pupil plane 16 become mirror images of one another because of the multiple internal reflections occurring in the rod 20. In that case, it may suffice to use optical components 30' which direct light into one of the regions Ra to Rd that have mirror-symmetry in the pupil plane 16, as indicated in FIG. 5. However, it is desirable to use optical components 30' which direct light into all four of the regions Ra to Rd, since this will decrease the sensitivity for transmission differences between optical components or for a nonuniform illumination of all optical components. Using this strategy, the number of optical components that direct radiation to a given region in the pupil plane is increased fourfold.

Figure 6:
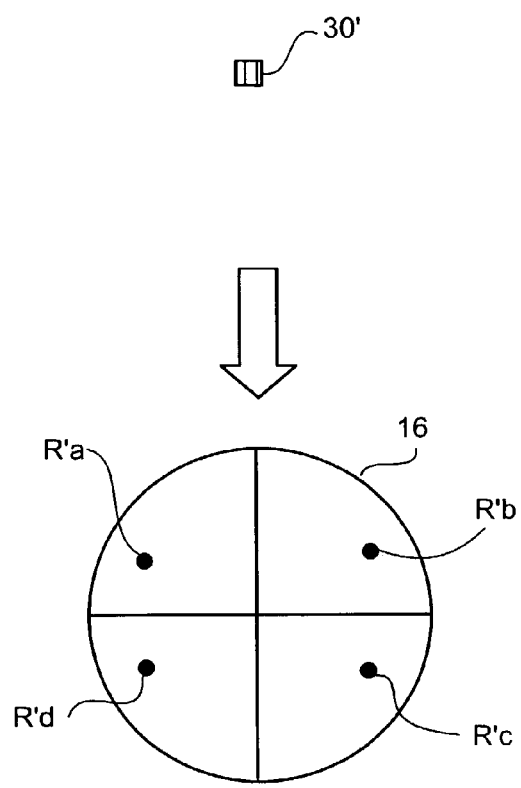

A further advantage accrues in the case of using an integrator rod when also the optical components 30' are square. In that case, the optical component 30' can be rotated by 90°, as indicated in FIG. 6, to cause it to direct light to regions R'a to R'd, which are mirror images in the diagonals of the points Ra to Rd from FIG. 5. The advantage here is that the number of previously manufactured optical components is decreased by a factor of 2.

Figure 7:
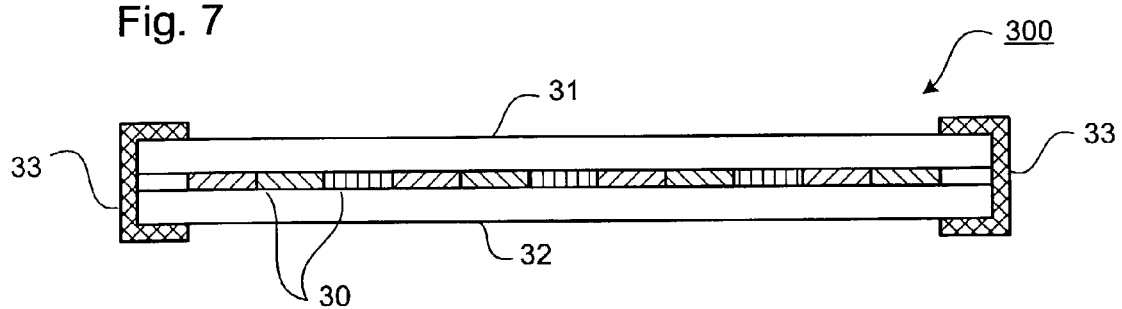
FIG. 7 is a cross-sectional view of an optical element according to the first embodiment of the present invention.

FIG. 7 shows an optical element 300 assembled according to an embodiment of the invention in cross-section. As can be seen, it comprises the array of optical components 30 sandwiched between two plates 31, 32 forming a support which is transparent or at least partially transmissive to the radiation of the beam. The two plates are held together, with the optical components 30 therebetween, by frame 33. The optical components 30 can easily be assembled into an array on one of the plates 31, 32. The other plate is then placed on top and the frame 33 attached to hold the assembly rigidly together. The optical components can be rearranged or reused by releasing the frame 33. The optical components may also be assembled onto a single plate. The support may be locally opaque to prevent radiation passing through any gap between the optical components 30. This may be achieved by providing a chromium grid on one or both of the plates 31, 32.

It should be noted that the arrangement of different optical components 30 in the optical element 300 does not, if the element 300 is evenly illuminated, affect the intensity distribution in the pupil plane. This is because position in the plane of the optical element will correspond to a direction in the pupil plane, and vice versa. This implies that the different optical components can be arranged as is most convenient for assembly. However, if there is any non-uniformity in the illumination of the optical element it may be desirable that optical components directing light to overlapping regions in the pupil plane are separated in the optical element so as to average out the uniformity errors.

It should also be noted that while in the examples described above each optical component directs light to a similar-sized region in a pupil plane, it is possible to provide optical components that direct light to narrower or broader regions, or even to the whole of the pupil plane, to enable the creation of intensity distributions with highly-localized intensity peaks, more gradually varying intensities and a degree of general background radiation (e.g. for soft quadrupole modes).

In order to enable rapid identification of the type and orientation of the optical components, a test device may be used. Such a device consists of a holder in which an optical component may be mounted and a light source, e.g. a visible light laser of low (safe) power, for directing a beam of substantially collimated radiation onto the component and impinging on a target having different areas marked out to indicate the type and orientation of the component. The test device may also use non-visible radiation if the target is made fluorescent or replaced by a suitable detector.

A similar device may be used to enable testing of the assembled optical element. Alternatively, the assembled element may be tested in-situ in the lithographic apparatus using known tools for in-situ pupil plane measurement.

A second embodiment of the invention is the same as the first embodiment but also includes control over the polarization state of the beam.

Figure 8:
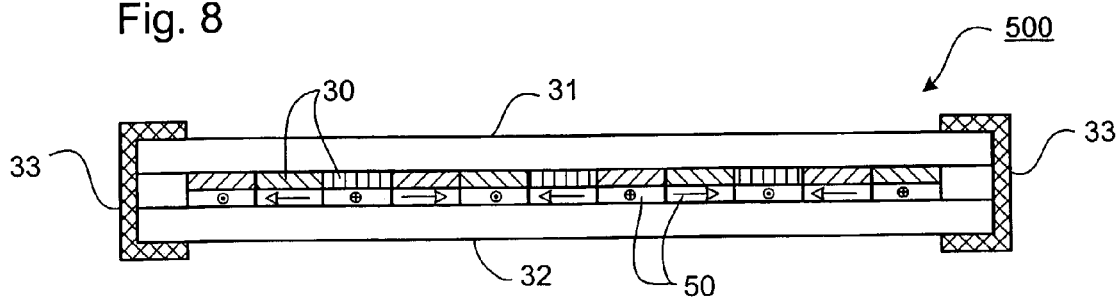
FIG. 8 is a cross-sectional view of an optical element according to a second embodiment of the invention.

FIG. 8 illustrates an optical element 500 according to the second embodiment of the invention. It is essentially the same as the optical element 300 but includes polarization changing components 50, such as for example half lambda plates, arranged in various orientations as desired to control the polarization of the illumination beam. According to their orientations, the polarization changing components 50 rotate the polarization state of a polarized projection beam PB, which may, for example, be generated by an excimer laser. Thus the relative intensities of different polarization states in the beam can be controlled, as can the distribution of polarization in the pupil, due to the combined action of the polarization changing components 50 and on top of them the optical components 30 which redirect the radiation. It may be appreciated that, although FIG. 8 shows an example of an optical element made of two layers of optical components, a third or fourth layer of optical components might be added to the optical element if so required.

Alternatively, an optical element that is made substantially out of one layer of polarization changing components can be placed in a pupil plane, as to directly affect the polarization state of radiation corresponding to certain regions in that pupil plane.

The polarization changing components 50 may be manufactured by cutting up a larger optical element, e.g. a half lambda plate. As shown, the polarization changing components 50 are the same size as and aligned with the optical component 30, which is convenient if it is desired to control the polarization distribution in the pupil. However, it is not essential that the polarization changing components 50 are the same size as and aligned with the optical components 30. Larger polarization changing elements may be easier to manufacture and assemble, and may be more convenient if it is desired to control only the relative intensities of different polarization states rather than their fine distribution in the pupil plane. It may also be advantageous to have redirecting components that are larger than the polarizing components.

If only the polarization state is to be changed, the polarization changing components 50 may be used alone, without the redirecting optical components 30. If the components 50 are somehow required to be identical, a conventionally manufactured plate-like polarizing material, such as for example a retarder plate, can be used as a support plate for the redirecting optical components 30, avoiding the need for an extra transparent support plate.

In the event that the projection beam is unpolarized, the polarization changing components 50 may be polarizers, rather than retarder plates.

Instead of being separate from the optical components 30, the polarization changing components 50 may be bonded to the optical components. This makes assembly of an optical element easier but means that the "kit" must contain a greater number of components, covering all necessary combinations of redirection and change of polarization state. Polarization changing components 50 bonded to optical components 30 may conveniently be produced by bonding large retarder plates to large optical elements which are then separated into small components.

Integrated polarization changing and redirecting optical components may be made by forming the redirecting optical elements from a substrate material that forms an appropriate wave plate (retarder plate). This eliminates the need for bonding or aligning the polarization changing components to the redirecting components.

Figure 9:
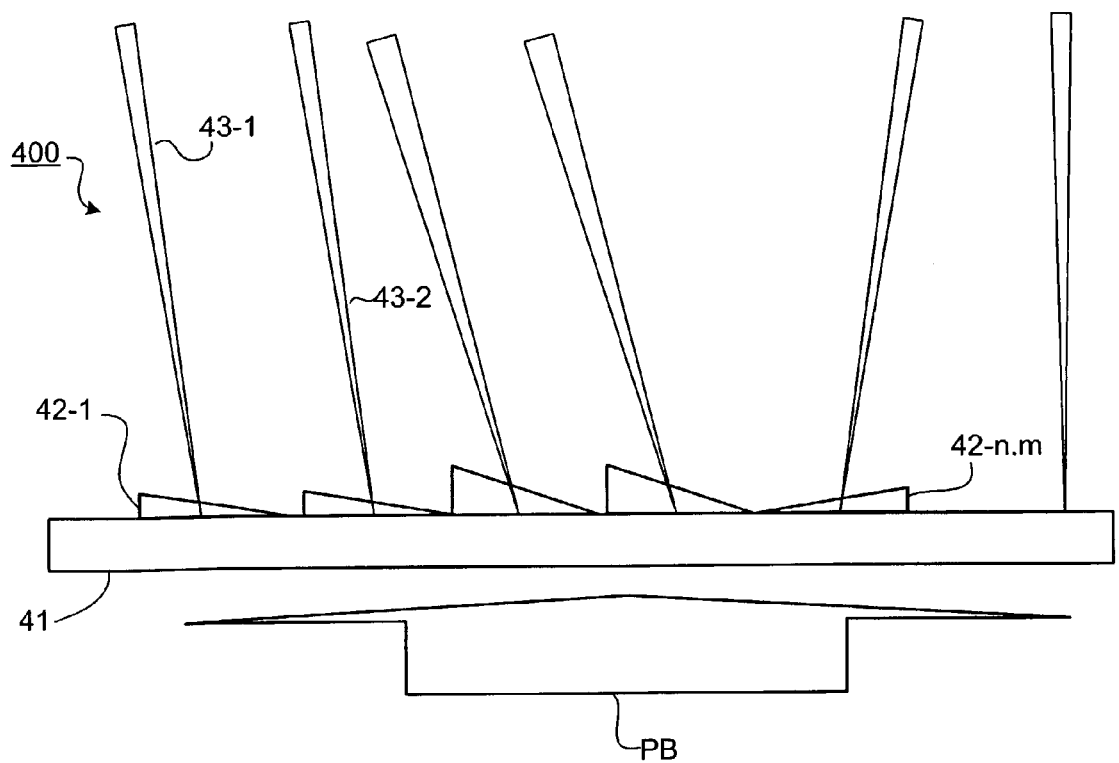
FIG. 9 is a cross-sectional view of an optical element according to a third embodiment of the invention.

A third embodiment of the present invention is the same as the first embodiment save in the construction of the optical element, which is described below and shown in FIG. 9.

In the third embodiment, the optical element 400 comprises a plate-like optical element 41 that directs incident radiation from the beam PB into a narrow range of angles. The plate-like element may be a diffractive, refractive, or diffusive optical element, e.g. a diffusor plate. On the output side an array of wedges 42-1 to 42-$n.m$ are provided; these may also be placed on the input side if preferred. The wedges 42-1 to 42-$n.m$ have differing wedge angles and so emit narrow cones of radiation 43-1, 43-2 at differing angles. The differing angles of the cones translate into different regions of the pupil plane 16.

The third embodiment may be advantageous as compared to the first in that wedges can be manufactured more cheaply than, for example, different diffractive optical components 30. The wedges can simply be placed on the plate-like element 41 and held in place by gravity or held between element 41 and a second plate-like element. The second plate-like element may have a similar function to element 41 or may be a simple transparent plane plate.

Polarization changing components 50, as described in relation to the second embodiment, may also be employed in the third embodiment, for example situated between the wedges 42-1 to 42-$n.m$ and the plate-like element 41.

A fourth embodiment of the invention is based on the third embodiment but combines the divergence function into the wedges.

Figure 10:
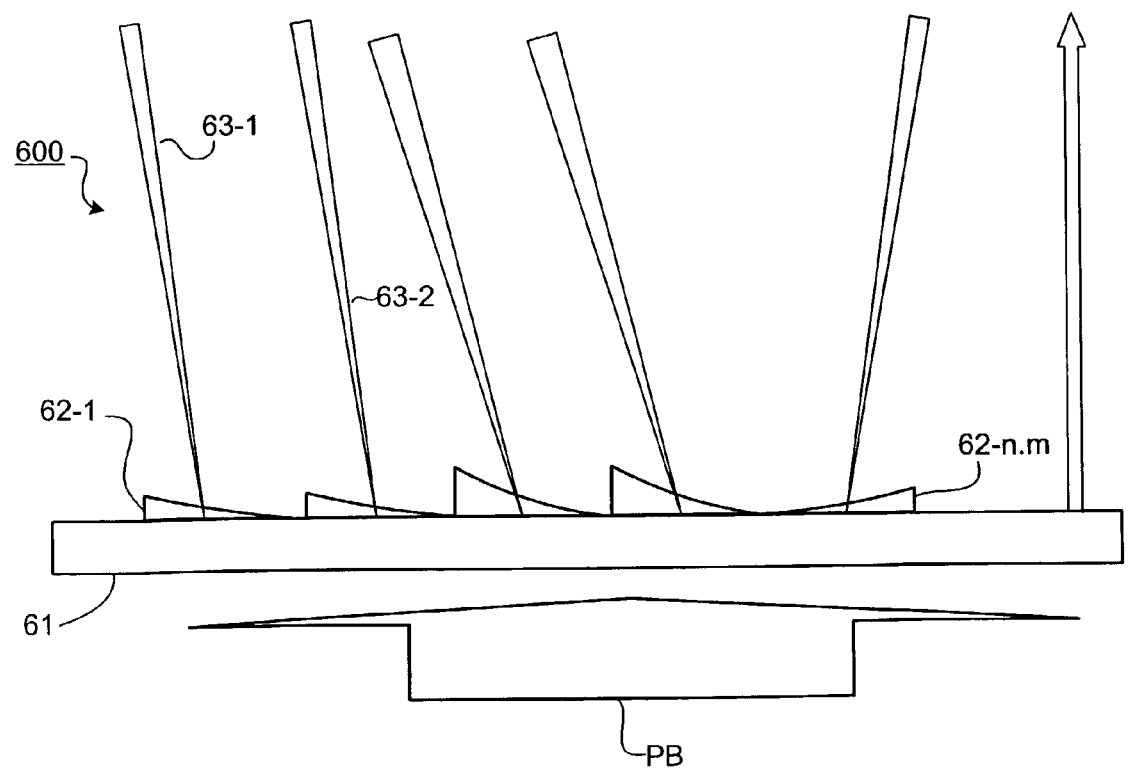
FIG. 10 is a cross-sectional view of an optical element according to a fourth embodiment of the invention.

As shown in FIG. 10, each wedge 62-1 to 62-$n.m$ of the redistributive optical element 600 has a shape that combines a wedge and an optical power, e.g. a concave spherical surface. This allows the cones 63-1, 63-2 to have different angles allowing greater control over the pupil plane distribution. As with the third embodiment, polarization changing components may be included.

If the diverging function is fully effected by the wedges 62, the plate-like element 61 may be a simple plane plate, with no optical effect.

While specific embodiments of the invention have been described above, it will be appreciated that the invention may be practiced otherwise than as described. The description is not intended to limit the invention.

What is claimed is:

1. A kit of parts for assembling an optical element for effecting a desired change in incident radiation at a plane of a radiation system of a lithographic apparatus, the kit of parts comprising:
   a plurality of previously manufactured optical components, each component having an effect on the incident radiation, wherein the effect of at least some of the optical components is different than the effect of others of the optical components; and
   a support constructed and arranged to releasably hold a user selectable subset of the plurality of optical components in an array, wherein optical components of the user selectable subset in the array are reconfigurable to assemble a plurality of different optical elements from the same user selectable subset.

2. A kit of parts according to claim 1, wherein the effect of at least some of the optical components is a change of direction of incident radiation.

3. A kit of parts according to claim 2, wherein all of the optical components direct incident radiation into four mutually symmetric directions.

4. A kit of parts according to claim 2, wherein all of the optical components direct incident radiation into respective regions of one quadrant of a pupil plane of the lithographic apparatus.

5. A kit of parts according to claim 2, wherein all of the optical components are square in shape and direct incident radiation into respective regions of one half of one quadrant of a pupil plane of the lithographic apparatus.

6. A kit of parts according to claim 2, wherein the optical components are selected from a group of optical components comprising diffractive, refractive, reflective, and diffusive optical components.

7. A kit of parts according to claim 1, wherein the effect of the at least some of the optical components is a change of polarization state of the incident radiation.

8. A kit of parts according to claim 7, wherein the optical components are selected from a group of optical components comprising optical components that effect a rotation of the polarization state and optical components that effect an at least partial polarization of the incident radiation.

9. A kit of parts according to claim 1, wherein the effect of the at least some of the optical components is a change of both direction and polarization state of the incident radiation.

10. A kit of parts according to claim 1, wherein the support is partially transmissive for the incident radiation.

11. A kit of parts according to claim 10, wherein the support comprises a plate-like optical element for directing the incident radiation into a narrow range of angles.

12. A kit of parts according to claim 11, wherein the optical components comprise refractive wedges.

13. A method of assembling an optical element for effecting a desired change in incident radiation at a plane of a radiation system of a lithographic apparatus, the method comprising:
    selecting, from a plurality of previously manufactured optical components which have different effects on the incident radiation, optical components to effect the desired change; and
    releasably mounting the selected optical components in an array on a support to form the optical element, wherein optical components of the user selectable subset in the array are reconfigurable to assemble a plurality of different optical elements from the same user selectable subset.

14. A method according to claim 13, wherein the plurality of previously manufactured optical components comprise a plurality of first optical components that effect a change of direction of the incident radiation and a plurality of second optical components that effect a change of polarization state of the incident radiation.

15. An optical element for effecting a desired change in incident radiation at a plane of a radiation system of a lithographic apparatus, the optical element comprising:
    a plurality of previously manufactured optical components, each component having an effect on the incident radiation, wherein the effect of at least some of the optical components is different than the effect of others of the optical components; and
    a support constructed and arranged to releasably hold a user selectable subset of the plurality of optical components in an array, wherein optical components of the user selectable subset in the array are reconfigurable to assemble a plurality of different optical elements from the same user selectable subset.

16. An optical element according to claim 15, wherein the optical components are selected from a group of optical components comprising redirective optical components, polarization changing optical components, and optical components that effect both direction and polarization state of incident radiation.

17. An optical element according to claim 15, wherein the support comprises a plate-like optical element for directing incident radiation into a narrow range of angles.

18. An optical element according to claim 15, wherein the plurality of previously manufactured optical components comprises a first layer of optical components that effect a change of polarization state of the incident radiation and a second layer of optical components that effect a change of direction of the incident radiation.

19. A lithographic apparatus, comprising:
 a radiation system constructed and arranged to provide a projection beam of radiation;
 a support constructed and arranged to support a patterning device, the patterning device constructed and arranged to pattern the projection beam according to a desired pattern;
 a substrate table constructed and arranged to hold a substrate; and
 a projection system constructed and arranged to project the patterned beam onto a target portion of the substrate, wherein the radiation system comprises an optical element for effecting a desired change in incident radiation at a plane of the radiation system, the optical element having been assembled by releasably mounting a user selectable subset of a plurality of previously manufactured optical components having different effects on the incident radiation in an array on a support, wherein optical components of the user selectable subset in the array are reconfigurable to assemble a plurality of optical elements from the same user selectable subset.

20. A device manufacturing method, comprising:
 providing a beam of radiation using a radiation system;
 patterning the beam of radiation with a pattern in its cross-section;
 projecting the patterned beam of radiation onto a target portion of a substrate; and
 placing in the radiation system an optical element for effecting a desired change in incident radiation at a plane of the radiation system, the optical element having been assembled by releasably mounting a user selectable subset of a plurality of previously manufactured optical components having different effects on the incident radiation in an array on a support, wherein optical components of the user selectable subset are reconfigurable to assemble a plurality of different optical elements from the same user selectable subset.

* * * * *